(12) United States Patent
Chen et al.

(10) Patent No.: US 9,808,891 B2
(45) Date of Patent: Nov. 7, 2017

(54) TOOL AND METHOD OF REFLOW

(71) Applicant: Taiwan Semiconductor Manufacturing CO., LTD., Hsinchu (TW)

(72) Inventors: Shih-Yen Chen, Hsinchu (TW); Tzi-Yi Shieh, Hsinchu (TW); Yuh-Sen Chang, Zhupei (TW); Chung-Li Lee, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 106 days.

(21) Appl. No.: 14/156,881

(22) Filed: Jan. 16, 2014

(65) Prior Publication Data

US 2015/0201502 A1    Jul. 16, 2015

(51) Int. Cl.
| | |
|---|---|
| *B23K 37/00* | (2006.01) |
| *H01L 21/67* | (2006.01) |
| *B23K 37/04* | (2006.01) |
| *H01L 23/00* | (2006.01) |
| *B23K 1/00* | (2006.01) |
| *B23K 3/08* | (2006.01) |
| *H01L 21/687* | (2006.01) |
| *H05K 3/00* | (2006.01) |
| *H05K 3/34* | (2006.01) |

(52) U.S. Cl.
CPC ............ *B23K 37/04* (2013.01); *B23K 1/0016* (2013.01); *B23K 3/08* (2013.01); *H01L 21/67109* (2013.01); *H01L 21/67115* (2013.01); *H01L 21/68742* (2013.01); *H01L 24/11* (2013.01); *H01L 24/742* (2013.01); *H01L 24/95* (2013.01); *H01L 2224/1181* (2013.01); *H01L 2224/11849* (2013.01); *H01L 2224/13101* (2013.01); *H01L 2224/81191* (2013.01); *H05K 3/0008* (2013.01); *H05K 3/3494* (2013.01); *H05K 2203/081* (2013.01); *H05K 2203/087* (2013.01)

(58) Field of Classification Search
USPC ..................................................... 204/298.25
See application file for complete search history.

(56) References Cited

U.S. PATENT DOCUMENTS

| | | | | |
|---|---|---|---|---|
| 3,652,444 | A * | 3/1972 | Lester ..................... | B01J 3/006 204/298.25 |
| 5,951,770 | A * | 9/1999 | Perlov et al. ................. | 118/719 |
| 6,331,212 | B1 * | 12/2001 | Mezey, Sr. .................... | 118/725 |
| 6,793,734 | B2 * | 9/2004 | Takagi ......................... | 118/715 |
| 6,817,821 | B2 * | 11/2004 | Henderson et al. .......... | 414/159 |
| 8,107,800 | B2 * | 1/2012 | Bezama ........... | H01L 21/67103 392/407 |
| 2001/0016293 | A1 * | 8/2001 | Nishi .................. | G03F 7/70691 430/22 |

(Continued)

*Primary Examiner* — Devang R Patel

(57) ABSTRACT

A tool and a method of reflow are provided. In various embodiments, the tool includes a chamber unit, a wafer lifting system, a heater, and an exhausting unit. The wafer lifting system is disposed in the chamber unit. The heater is coupled to the chamber unit, and configured to heat the wafer. The exhausting unit coupled to the chamber unit, and configured to exhaust gas in the chamber unit. The wafer lifting system is configured to receive and move the wafer in the chamber unit, and to provide a vertical distance between the heater and the wafer in the chamber unit.

15 Claims, 9 Drawing Sheets

(56) References Cited

U.S. PATENT DOCUMENTS

| | | | | |
|---|---|---|---|---|
| 2001/0030184 | A1* | 10/2001 | Richert et al. | 219/388 |
| 2011/0073039 | A1* | 3/2011 | Colvin | 118/725 |
| 2013/0075455 | A1* | 3/2013 | Shimizu | 228/256 |
| 2013/0146647 | A1* | 6/2013 | Liu et al. | 228/202 |
| 2013/0256389 | A1* | 10/2013 | Ngai et al. | 228/176 |
| 2014/0262036 | A1* | 9/2014 | Reuter | H01L 21/6719 156/345.31 |

* cited by examiner

TOOL AND METHOD OF REFLOW

BACKGROUND

When electronic products are becoming smaller in size and more intelligent with a high performance and a high reliability, requirements to integrated circuit (IC) package techniques are accordingly increased for higher integration of IC. Among these IC package techniques, wafer bumping is used to form solder bumps over an entire wafer on which integrated circuits have been built. After the wafer bumping process, the wafer is cut into individual chips for inner lead bonding. The wafer bumping is a critical step for device packaging, because the bumps formed on the wafer serve as electrical, mechanical, and mounting connections for flip-chip assemblies. These bumps must exhibit superior adhesion to the chips and minimum electrical resistance.

The bumps are formed by depositing solder alloy onto metal pads of the wafer. The deposited solder alloy is then performed a reflow process to reflow at a certain thermal profile including temperature above its melting point, form a metallic interconnect with the chips, and convert from its as-plated form into a spherical shape driven by liquid surface tension. Besides, the deposited solder alloy typically contains a native metal oxide layer on its surface. When the solder alloy is melted, the metal oxide layer remains in solid phase and acts as a skin. This constrains the molten solder surface and hinders the formation of uniform, spherical bumps. Therefore, it is also important to remove surface oxides from the deposited solder during the reflow process.

As aforementioned, since requirements to wafer bumping techniques are increased and higher, the thermal profile controlling and the metal oxide removal of the solder alloy during the reflow process have to be well controlled. Accordingly, improvements in reflow tools and methods of reflow continue to be sought.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
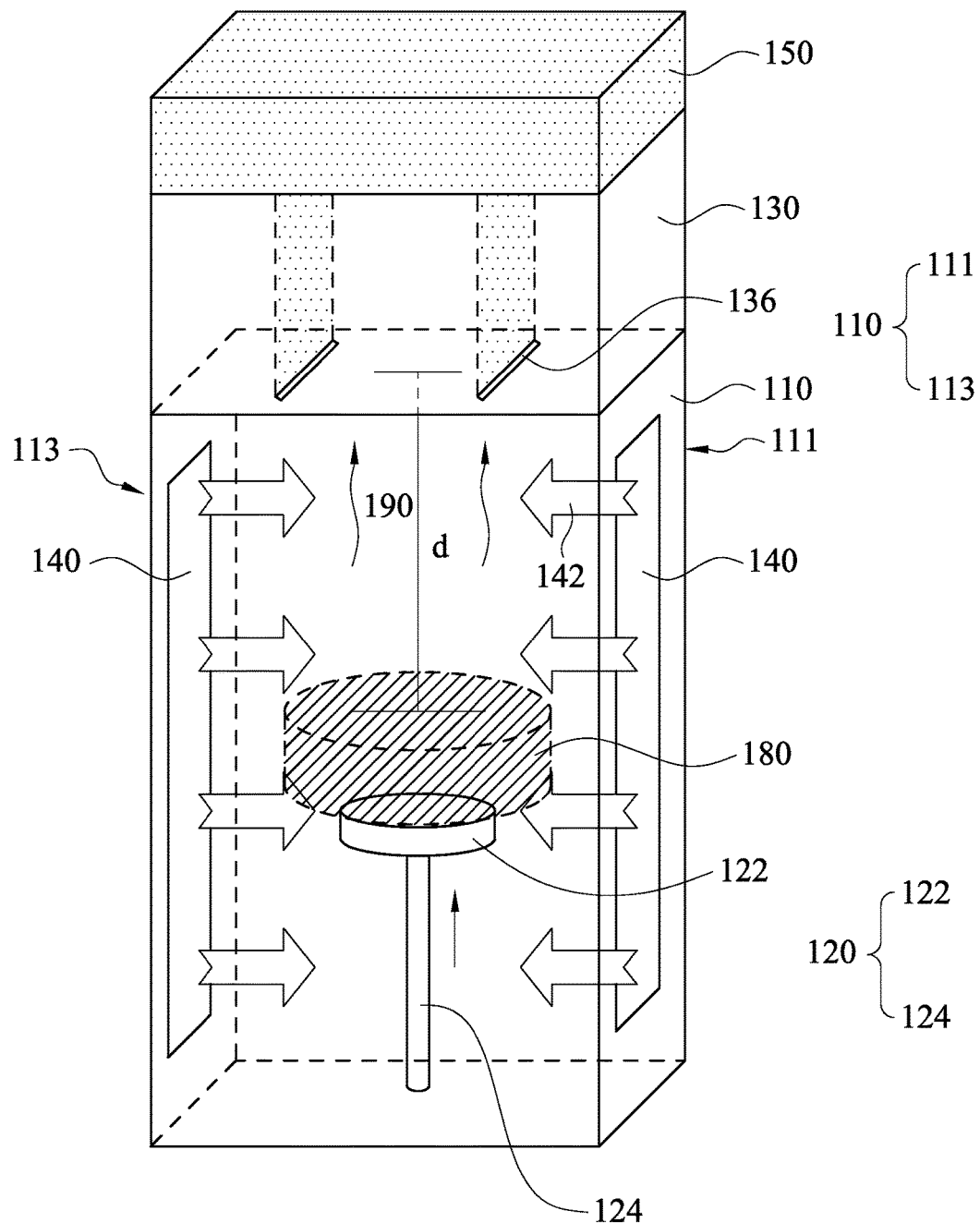
FIG. 1 is a schematic diagram illustrating a portion of a reflow tool according to various embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The singular forms "a," "an" and "the" used herein include plural referents unless the context clearly dictates otherwise. Therefore, reference to, for example, a liner layer includes embodiments having two or more such liner layers, unless the context clearly indicates otherwise. Reference throughout this specification to "one embodiment" or "an embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, these figures are intended for illustration.

Since the thermal profile of the solder alloy during the reflow process has to be well controlled, large space of a reflow tool is often required to provide multiple thermal zones for the wafer to travel. Therefore, footprint design of numerous reflow tools is large. The cost of settling a reflow tool is accordingly increased. In this regard, reflow tools and methods of soldering are provided according to various embodiments of the present disclosure.

FIG. 1 is a schematic diagram illustrating a portion of a reflow tool according to various embodiments of the present disclosure. As illustrated in FIG. 1, the reflow tool 100 includes a chamber unit 110, a wafer lifting system 120, a heater 130, and an exhausting unit 150. The chamber unit 110 is configured to perform the reflow process on the wafer 180. Flip chip is a technique in which a chip is flipped over and then connected with a board by solder balls formed on the surface of the chip so as to reduce the package size. The flip chip technology may satisfy the requirement for high performance with a smaller size. Bump fabrication is a key technique in flip chip technology. The bump is a metal solder ball formed by depositing solder over an interconnection metal layer of a chip and reflowing at a certain temperature. Processes for bump fabrication could start from providing a wafer. The wafer has a surface with a passivation layer and an interconnection metal layer. An under-bump metallurgy (UBM) layer is formed on the surface of the wafer. Next, a photoresist layer is coated over the UBM layer, and is subjected to exposure and development so as to form a photoresisit opening. Solder alloy for bump is deposited over the photoresisit opening. Then the photoresisit layer and part of the UBM layer are removed. Flux is applied over the surface of the wafer, and is reflowed at a certain temperature to form a solder ball as the bump. Then, the flux on the bump and over the surface of the wafer is removed. The typical flux consists of colophony resin, active agent, solvent, thixotropic agent and other additives. In the some reflow process, the flux is mainly used to remove contaminations on the solder surface, deoxidize metal oxides, and facilitate the reflow; in the some reflow process, the bump having a desired shape is formed by using the flux and controlling the temperature of the reflow. The reflow process may be a flux reflow process. Flux is a reducing agent designed to help reduce metal oxides at the points of solder contact to improve the electrical connection and mechanical strength of solders on the wafer 180. The two principal types of flux are acid flux and rosin flux. The acid flux is used for metal mending and plumbing, and the rosin flux is used in electronics where the corrosiveness of acid flux and vapors released when solder is heated would risk damaging delicate circuitry. Due to concerns over atmospheric pollution and hazardous waste disposal, the electronics industry has been gradually shifting from the flux reflow process to a fluxless reflow process. In the fluxless reflow process, the flux is replaced by a deoxidizing gas. Similarly, the deoxidizing gas is a reducing agent designed to help reduce metal oxides at the points of solder contact to improve the electrical connection and mechanical strength of solders on the wafer 180.

Referring to FIG. 1, the wafer lifting system 120 is disposed in the chamber unit 110. The wafer lifting system 120 is configured to receive and move the wafer 180 in the chamber unit 110 during the reflow process. The heater 130 is coupled to the chamber unit 110, and configured to heat the wafer 180 during the reflow process. As illustrated in FIG. 1, in various embodiments of the present disclosure, the heater 130 is disposed above the chamber unit 110. It should be noticed that the wafer lifting system 120 is configured to receive and move the wafer 180 in the chamber unit 110, and to provide a vertical distance d between the heater 130 and the wafer 180 in the chamber unit 110. As illustrated in FIG. 1, in various embodiments of the present disclosure, the wafer lifting system 120 includes a wafer holder 122 and a lifting pin 124. The wafer holder 122 is configured to receive the wafer 180 and the lifting pin 124 is coupled to the wafer holder 122 and configured to move the wafer 180 in the chamber unit 110. In various embodiments of the present disclosure, the lifting pin 124 moves vertically to provide the vertical distance d between the heater 130 and the wafer 180 in the chamber unit 110. The vertical distance d affects temperature of the wafer 180. As aforementioned, various temperatures are required to pre-wet, soak, melt, and cool the solder alloy during the reflow process. In other words, a proper thermal profile of the wafer 180 is required to be form by the reflow process. As illustrated in FIG. 1, the vertical distance d is decreasing when the wafer lifting system 120 is elevating the wafer 180, and the temperature of the wafer 180 is accordingly increasing while the vertical distance d is decreasing. On the other hand, the vertical distance d is increasing when the wafer lifting system 120 is lowering the wafer 180, and the temperature of the wafer 180 is accordingly decreasing while the vertical distance d is increasing. Therefore, the thermal profile of the wafer 180 could be controlled by the wafer lifting system 120. In various embodiments of the present disclosure, the lifting pin 124 of the wafer lifting system 120 is capable to move vertically to provide the vertical distance d between the heater 130 and the wafer 180 in the chamber unit 110. Accordingly, the thermal profile of the wafer 180 could be controlled in a flexible way. In other words, it is not necessary for the reflow tool 100 according to various embodiments of the present disclosure to have the heaters with various temperatures, and therefore a smaller footprint than those have the heaters with various temperatures is required. Accordingly, less space is required to settle the reflow tool 100 in a factory, and the cost of settling the reflow tool could be further reduced. In addition, the wafer 180 is moved by the wafer lifting system 120 of the reflow tool 100 instead of putting on a transferring belt with inert gas purge of numerous reflow tools. Therefore, the wafer 180 could be moved precisely and smoothly by the wafer lifting system 120, and risks of vibration during the reflow process could be eliminated. Accordingly, failure of solder connection could be also improved.

Figure 2:
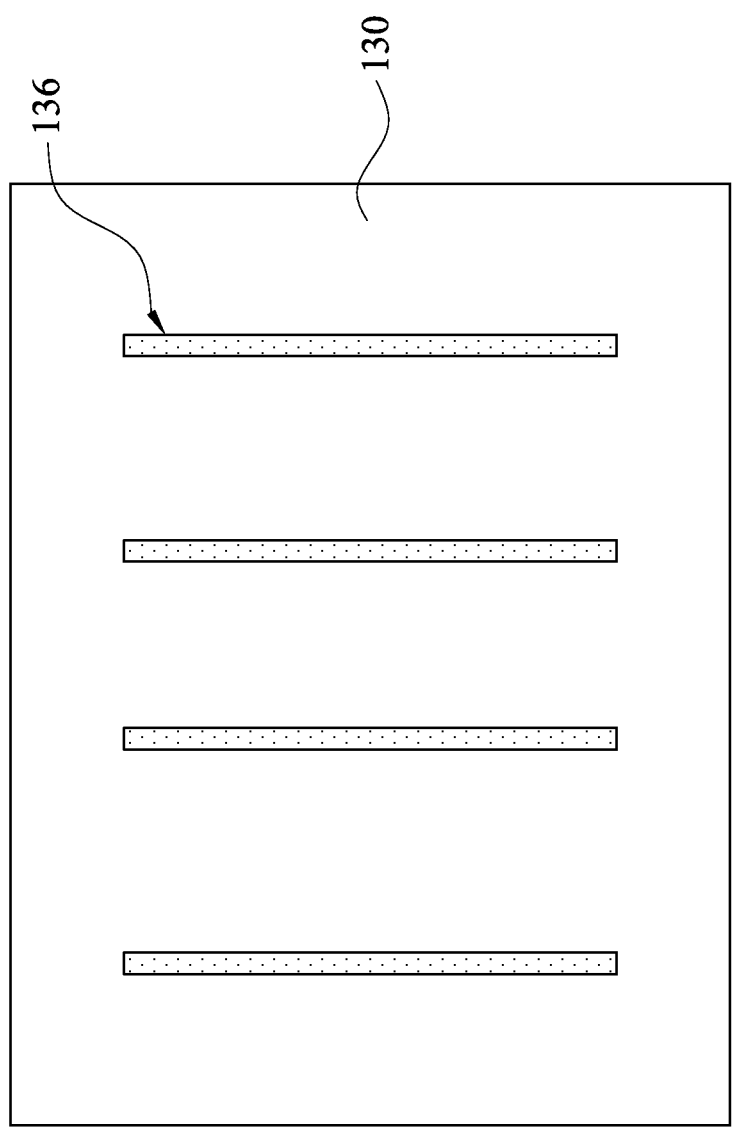
FIG. 2 is a top view of a portion of the reflow tool illustrated in FIG. 1.

Referring to FIG. 1 and FIG. 2, FIG. 2 is a top view of a portion of the reflow tool illustrated in FIG. 1. The exhausting unit 150 is coupled to the chamber unit 110, and configured to exhaust gas 190 in the chamber unit 110. The gas 190 could be generated during the reflow process. As illustrated in FIG. 1, in various embodiments of the present disclosure, the heater 130 is disposed above the chamber unit 110, and the heater 130 has a plurality of slits 136. The exhausting unit 150 is disposed on the heater 130. The exhausting unit 150 exhausts gas 190 in the chamber unit 110 through the plurality of slits 136. It should be notice that the exhausting unit 150 is disposed above the wafer 180, and configured to exhaust gas 190 in the chamber unit 110 during the reflow process. Therefore, the gas 190 flows upward from the surface of wafer 180. Accordingly, risk of particles depositing on the wafer 180 could be further reduced, and yield of the wafer 180 in the reflow process could be further improved.

Referring to FIG. 1 again, in various embodiments of the present disclosure, the reflow tool further includes a jet system 140 coupled to the chamber unit, and configured to jet a deoxidizing gas 142 on the wafer 180. As aforementioned, flux is a reducing agent designed to help reduce metal oxides at the points of solder contact to improve the electrical connection and mechanical strength of solders on the wafer 180. Due to concerns over atmospheric pollution and hazardous waste disposal, the electronics industry has been gradually shifting from the flux reflow process to the fluxless reflow process. In the fluxless reflow process, the deoxidizing gas 142 is the reducing agent designed to reduce metal oxides at the points of solder contact to improve the electrical connection and mechanical strength of solders on the wafer 180, and is jetted to the solders on the wafer 180 by the jet system 140 during reflow process. In various embodiments of the present disclosure, the deoxidizing gas 142 could be hydrogen gas, formic acid gas, or a combination thereof. By-products generated by redox reaction between the solders on the wafer 180 and the deoxidizing gas 142 during the fluxless reflow process are relatively clean, non-toxic, and could be easily vented out of the chamber unit 110 by the exhausting unit 150. As illustrated in FIG. 1, in various embodiments of the present disclosure, the jet system 140 is disposed on two opposite sidewalls 111 and 113 of the chamber unit 110 to jet the deoxidizing gas 142 into the chamber unit 110. Therefore, a relative balance condition of jetting the deoxidizing gas 142 could be obtain, and vibration of the wafer 180 during the fluxless reflow process could be reduced. Accordingly, risk of bumping fail could be further improved. However, the present disclosure is not limited thereto. The jet system 140 could be designed in any proper shape and disposed on any proper positions to form a balance condition of jetting the deoxidizing gas 142 of the wafer 180.

Figure 3:
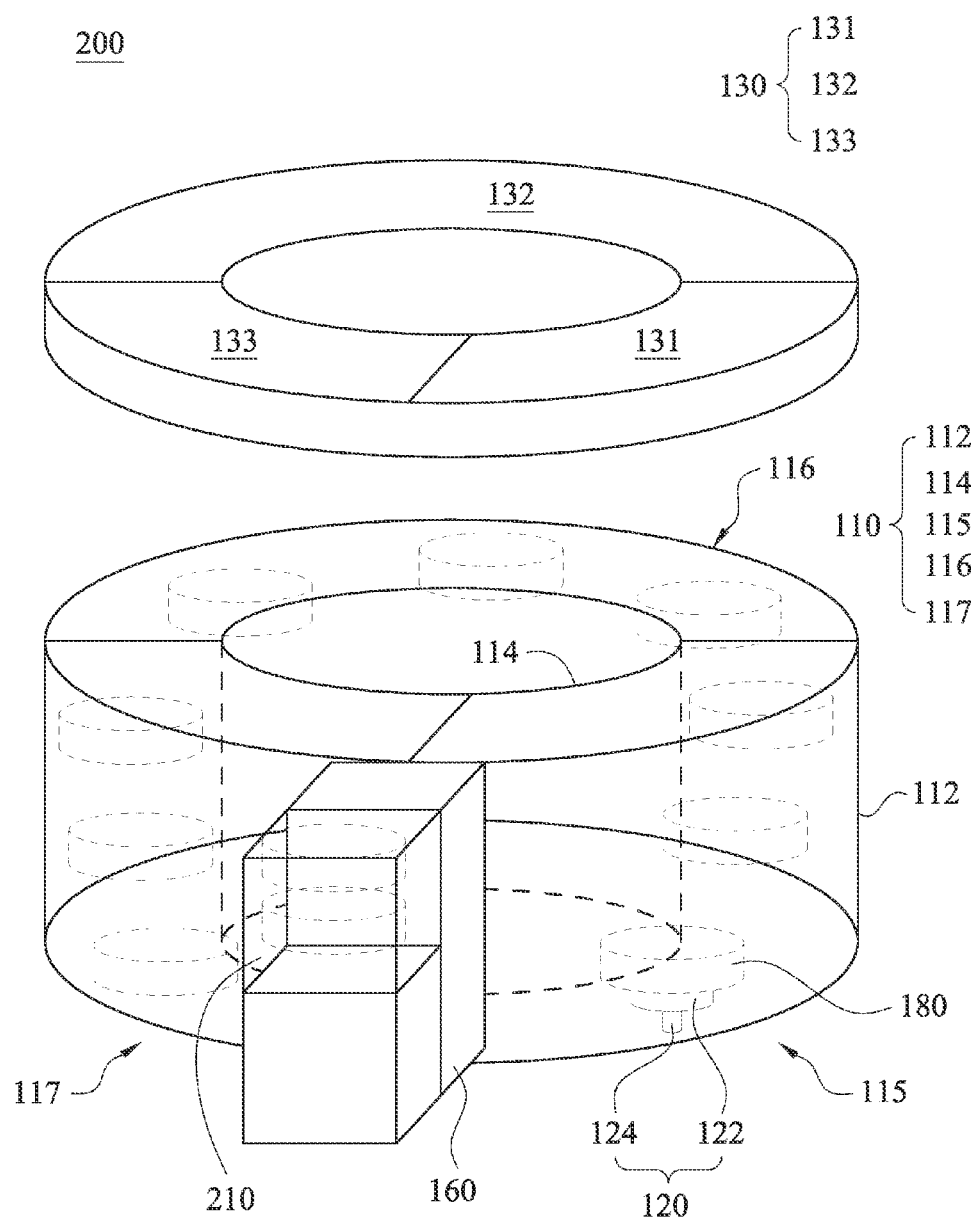
FIG. 3 is a schematic diagram illustrating a portion of a reflow tool according to various embodiments of the present disclosure.
Figure 4:
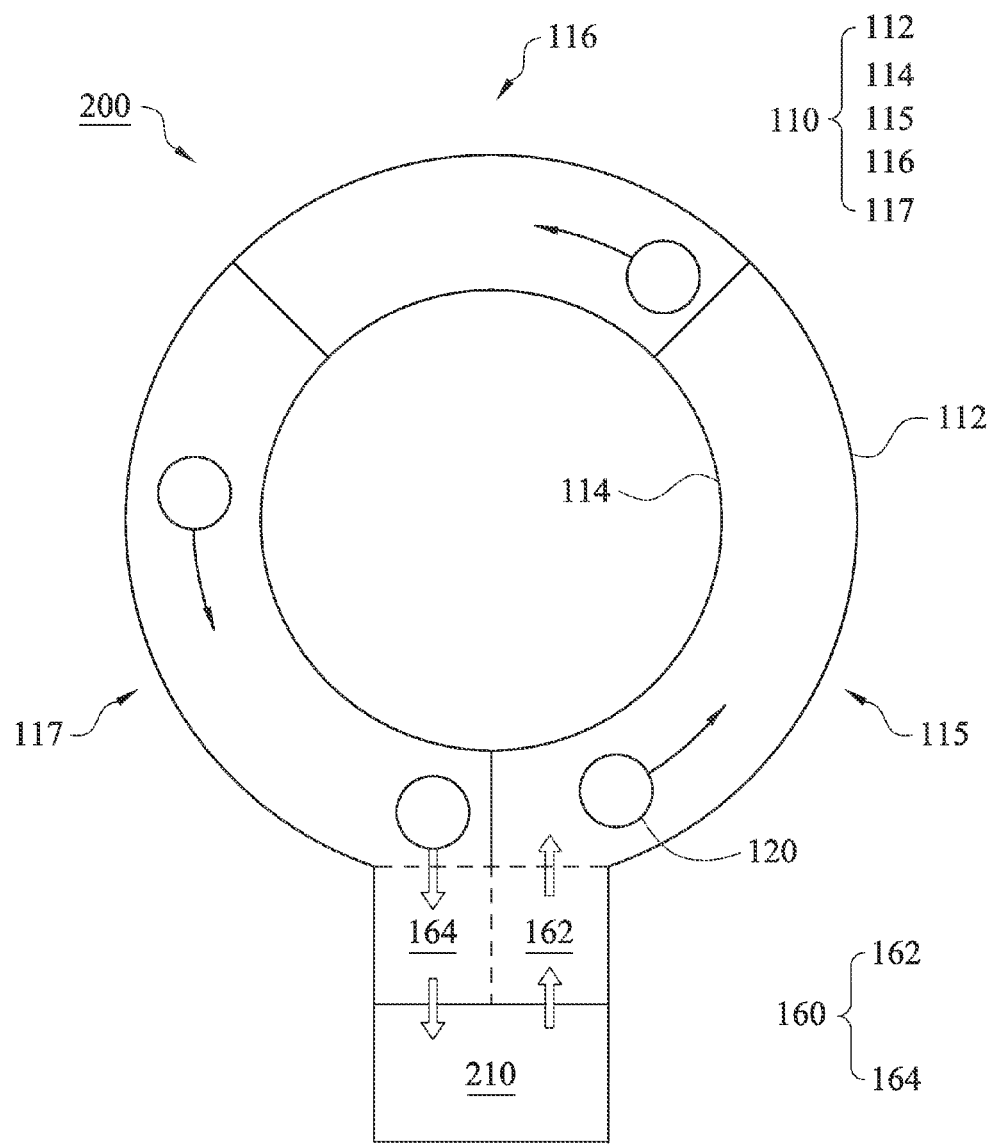
FIG. 4 is a schematic top-view illustrating the reflow tool according to various embodiments of the present disclosure.

FIG. 3 is a schematic diagram illustrating a portion of a reflow tool according to various embodiments of the present disclosure. FIG. 4 is a schematic top-view illustrating the reflow tool according to various embodiments of the present disclosure. As illustrated in FIG. 3 and FIG. 4, in various embodiments of the present disclosure, the chamber unit 110 includes an inner cylindrical shield 114 and an outer cylindrical shield 112. The inner cylindrical shield 114 and the outer cylindrical shield 112 constitute the chamber unit 110 as a ring shape chamber unit. The wafer lifting system 120 in the chamber unit 110 moves in a circular motion as shown in FIG. 4. Therefore, as illustrated in FIG. 3, the wafer 180 is moved by the wafer lifting system 120 in the circular motion during the reflow process. It should be noticed that the wafer lifting system 120 does not only provide the vertical distance between the heater 130 and the wafer 180 in the chamber unit 110, but also moves the wafer 180 in the circular motion during the reflow process. Therefore, the wafer 180 is moved in a spiral trace by the wafer lifting system 120 as shown in FIG. 3. In some embodiments of the present disclosure, the chamber unit 110 is covered by the heater 130, and the heater 130 is employed to provide a substantially uniform temperature. For example, three temperature zones 131,132 and 133 have substantially the same temperature as illustrated in FIG. 3. Therefore, the temperature of the wafer 180 could be only affected by the vertical distance between the heater 130 and the wafer 180. In various embodiments of the present disclosure, the vertical distance between the heater 130 and the wafer 180 in the chamber unit 110 further includes a reducing distance section, a constant distance section, and an increasing distance section. As illustrated in FIG. 3, in the reducing distance section, the vertical distance is decreasing when the wafer lifting system 120 is elevating the wafer 180 in a thermal zone 115 of the chamber unit 110, and the temperature of the wafer 180 is accordingly increasing while the vertical distance is decreasing; in the constant distance section, the vertical distance is constant when the wafer lifting system 120 is not elevating or lowering the wafer 180 in a thermal zone 116 of the chamber unit 110, and the temperature of the wafer 180 is accordingly constant while the vertical distance is constant; and in the increasing distance section, the vertical distance is increasing when the wafer lifting system 120 is lowering the wafer 180 in a thermal zone 117 of the chamber unit 110, and the temperature of the wafer 180 is accordingly decreasing while the vertical distance is increasing. In some other embodiments of the present disclosure, the chamber unit 110 is covered by the heater 130, and the heater 130 has a plurality of temperature zones. For example, three temperature zones 131,132 and 133 have different temperatures as illustrated in FIG. 3. The temperature of the wafer 180 could not only be affected by the vertical distance between the heater 130 and the wafer 180, but also be affected by different temperature zones 131, 132 and 133 of the heater 130. It should be noticed that since the wafer lifting system 120 in the chamber unit 110 provides the vertical distance between the heater 130 and the wafer 180 in the chamber unit 110 and also moves in the circular motion, a thermal profile of the wafer 180 for the reflow process could be formed when the wafer 180 is moved in a circle path as illustrated in FIG. 3 and FIG. 4. Therefore, the reflow tool 200 according to various embodiments of the present disclosure requires a smaller footprint than those with a straight path for the wafer to move. Accordingly, less space is required to settle the reflow tool 200 in a factory, and the cost of settling the reflow tool could be further reduced. In addition, the wafer 180 is moved by the wafer lifting system 120 of the reflow tool 200 instead of putting on a transferring belt with inert gas purge of numerous reflow tools. Therefore, the wafer 180 could be moved precisely and smoothly by the wafer lifting system 120, and risks of vibration during the reflow process could be eliminated. Accordingly, failure of solder connection could be also improved. Also illustrated in FIG. 3, in various embodiments of the present disclosure, the reflow tool 200 further includes a buffer zone 160 and at least one front opening unified pod 210. The buffer zone 160 is coupled to the chamber unit 110. The front opening unified pod 210 is coupled to the buffer zone 160. The buffer zone 160 is configured to transfer the wafer 180 between the front opening unified pod 210 and the wafer lifting system 120. As illustrated in FIG. 4, in various embodiments of the present disclosure, the buffer zone 160 includes a first buffer zone 162 and a second buffer zone 164. The first buffer zone 162 is coupled to the chamber unit 110, and configured to transfer the wafer 180 from the front opening unified pod 210 to the wafer lifting system 120. The second buffer zone 164 is coupled to the chamber unit 110, and configured to transfer the wafer 180 from the wafer lifting system 120 to the front opening unified pod 210. Therefore, two buffer zones (one is input and the other one is output) could further improve process efficiency (wafer per hour, WPH) of the reflow tool 200 while the wafers 180 are processed in a continuous process as illustrated in FIG. 3.

Figure 5:
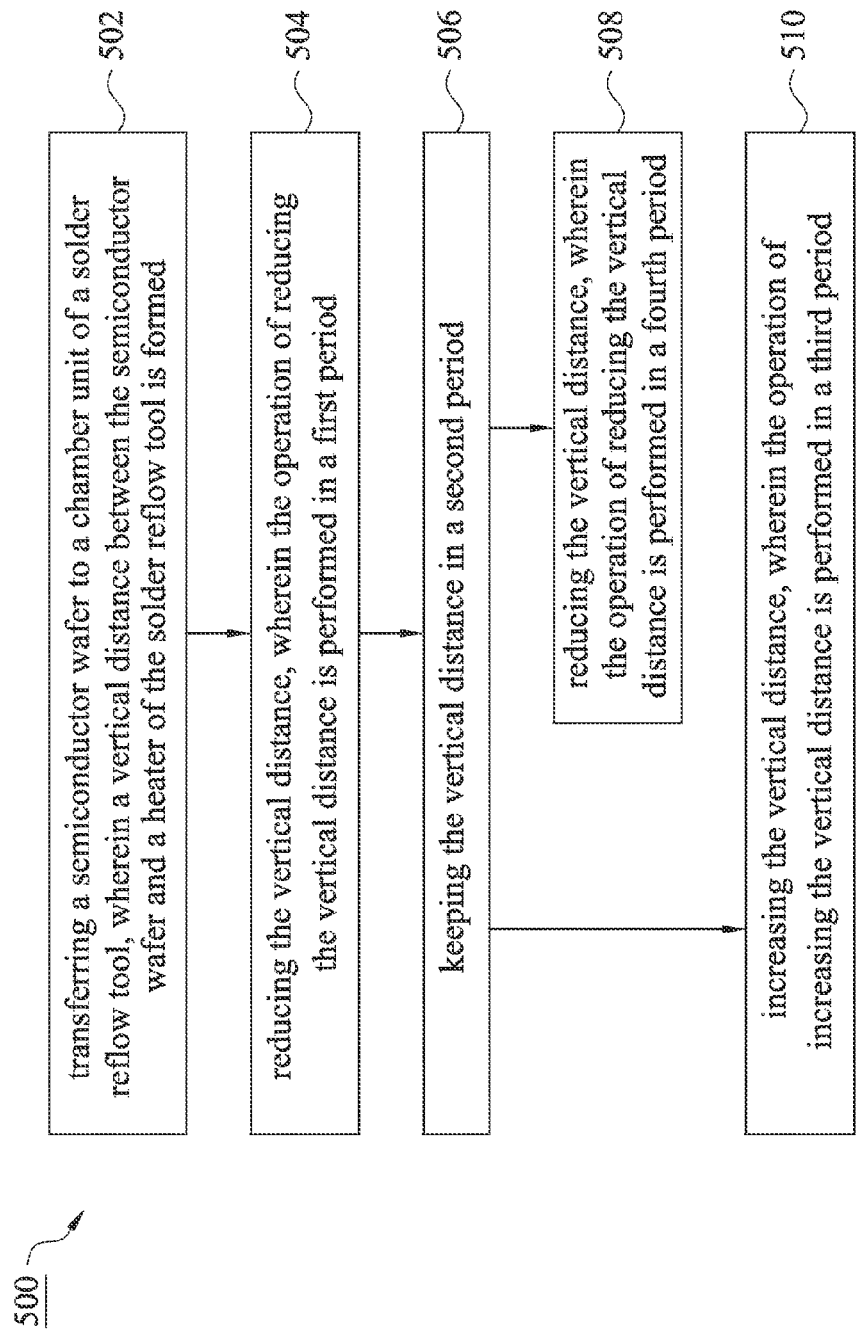
FIG. 5 is a flowchart illustrating a method of fluxless reflow according to various embodiments of the present disclosure.

FIG. 5 is a flowchart illustrating a method 500 of fluxless reflow according to various embodiments of the present disclosure. The method 500 begins with block 502 in which a wafer is transferred to a chamber unit of a reflow tool. A vertical distance between the wafer and a heater of the reflow tool is formed. The method 500 continues with block 504 in which the vertical distance is reduced. The operation of reducing the vertical distance is performed in a first period. The method 500 also includes keeping the vertical distance in a second period as shown in block 506, and increasing the vertical distance, wherein the operation of increasing the vertical distance is performed in a third period as shown in block 510. It should be noticed that a jet system of the reflow tool jets a deoxidizing gas during the operation of reducing the vertical distance and the operation of keeping the vertical distance in the second period. As aforementioned, the deoxidizing gas is the reducing agent designed to reduce metal oxides at the points of solder contact to improve the electrical connection and mechanical strength of solders on the wafer, and is jetted to the solders on the wafer by the jet system during the reflow process. In various embodiments of the present disclosure, between the operation of keeping the vertical distance in the second period and the operation of increasing the vertical distance, the method 500 further includes reducing the vertical distance, wherein the operation of reducing the vertical distance is performed in a fourth period as shown in block 508. In various embodiments of the present disclosure, the operations of reducing the first distance to a second distance, keeping the second distance for a second period, and increasing the second distance to a third distance are performed by a wafer lifting system of the reflow tool. The wafer lifting system includes a wafer holder configured to receive the wafer and a lifting pin coupled to the wafer holder. The wafer lifting system is configured to vertically move the wafer. The wafer lifting system is capable to move in a circular motion in the chamber unit, and the first period, second period and the third period are controlled by the wafer lifting system. The details of the method 500 are described in FIG. 6 and following paragraphs.

Figure 6:
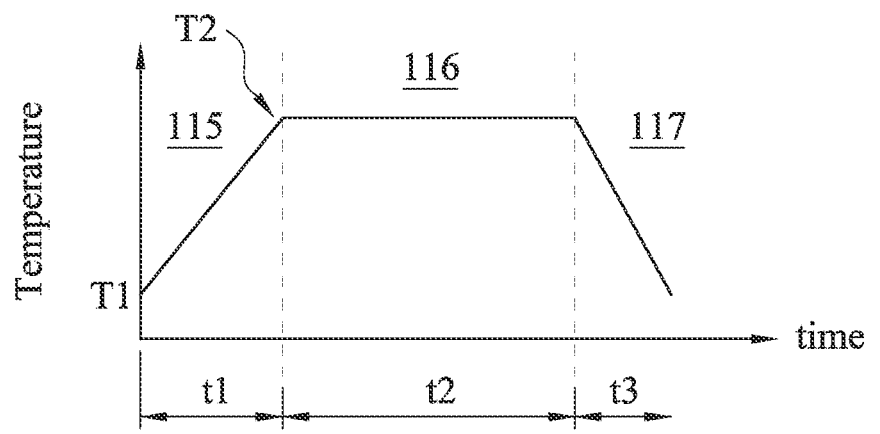
FIG. 6 is a schematic diagram of a thermal profiling illustrating the method of fluxless reflow according to various embodiments of the present disclosure.
Figure 6:
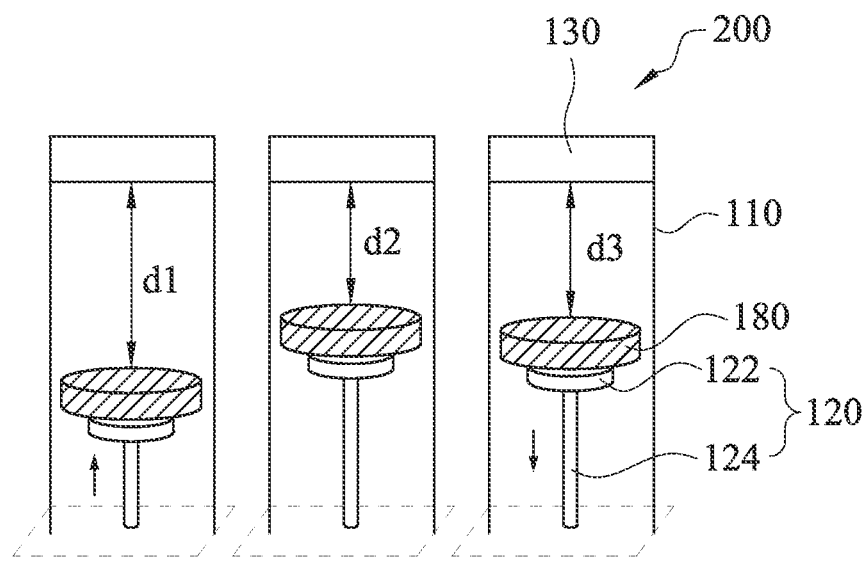

FIG. 6 is a schematic diagram of a thermal profiling illustrating the method of fluxless reflow according to various embodiments of the present disclosure. Referring to FIG. 6 and FIG. 3, after the wafer 180 is transferred to the chamber unit 110 of the reflow tool 200. The vertical distance d1 between the wafer 180 and the heater 130 of the reflow tool 200 is formed. The initial temperature of the wafer 180 is, for example, T1 as illustrated in FIG. 6. Next, the vertical distance d1 is reduced such that the temperature of the wafer 180 is accordingly increased. For example, the temperature of the wafer 180 could be increased from T1 to T2 as illustrated in FIG. 6. Also shown in FIG. 3, the operation of reducing the vertical distance d1 could be performed in the thermal zone 115 of the chamber unit 110 of the reflow tool 200. The operation of reducing the vertical distance d1 is performed in a first period t1. The first period t1 is to preheat and establish a ramp-up rate of the temperature of the wafer 180. As illustrated in FIG. 6, the ramp-up rate is a temperature/time slope in the thermal zone 115. It represents how fast the temperature of the wafer 180 changes. The ramp-up rate is, for example, between 0.5° C. and 5.0° C. per second. However, the present disclosure is not limited to it. The ramp-up rate could be properly controlled by the wafer lifting system 120, the temperature of the heater 130, the velocity of the circular motion of the wafer lifting system 120 (as illustrated in FIG. 3), or combinations thereof according to various solder materials applied on the wafer 180 or other process criteria. The jet system of the reflow tool 200 jets the deoxidizing gas to reduce surface tension of the solders on the wafer 180 for metallurgical bonding in the following operation.

Continually referring to FIG. 6, the vertical distance d2 is kept in a second period t2 such that the temperature of the wafer 180 is accordingly constant. For example, the temperature of the wafer 180 could be T2 as illustrated in FIG. 6. Also shown in FIG. 3, the operation of keeping the vertical distance d2 in a second period t2 could be performed in the thermal zone 116 of the chamber unit 110 of the reflow tool 200. Solders on the wafer 180 reflow in the second period t2, and the second period t2 is the part of the reflow process where the maximum temperature is reached. The jet system of the reflow tool 200 jets the deoxidizing gas to reduce surface tension of the solders on the wafer 180 to accomplish metallurgical bonding.

Continually referring to FIG. 6, the vertical distance d2 between the wafer 180 and the heater 130 of the reflow tool 200 is increased such that the temperature of the wafer 180 is accordingly decreased. For example, the temperature of the wafer 180 could be decreased from T2 to T1 as illustrated in FIG. 6. Also shown in FIG. 3, the operation of increasing the vertical distance, for example, from d2 to d3, could be performed in the thermal zone 117 of the chamber unit 110 of the reflow tool 200. The operation of increasing the vertical distance is performed in a third period t3. As illustrated in FIG. 6, the ramp-down rate is a temperature/time slope in the thermal zone 117. It represents how fast the temperature of the wafer 180 changes. In the third period t3, temperature of the wafer 180 is gradually cooled, and the solder joints on the wafer 180 are solidified. Proper cooling inhibits excess inter-metallic formation or thermal shock to the components of the wafer 180. The ramp-down rate is, for example, between 2.0° C. and 6.0° C. per second. However, the present disclosure is not limited to it. The ramp-down rate could be properly controlled by the vertical distance controlled by the wafer lifting system 120, the temperature of the heater 130, the velocity of the circular motion of the wafer lifting system 120 (as illustrated in FIG. 3), or combinations thereof according to various solder materials applied on the wafer 180 or other process criteria.

Figure 7:
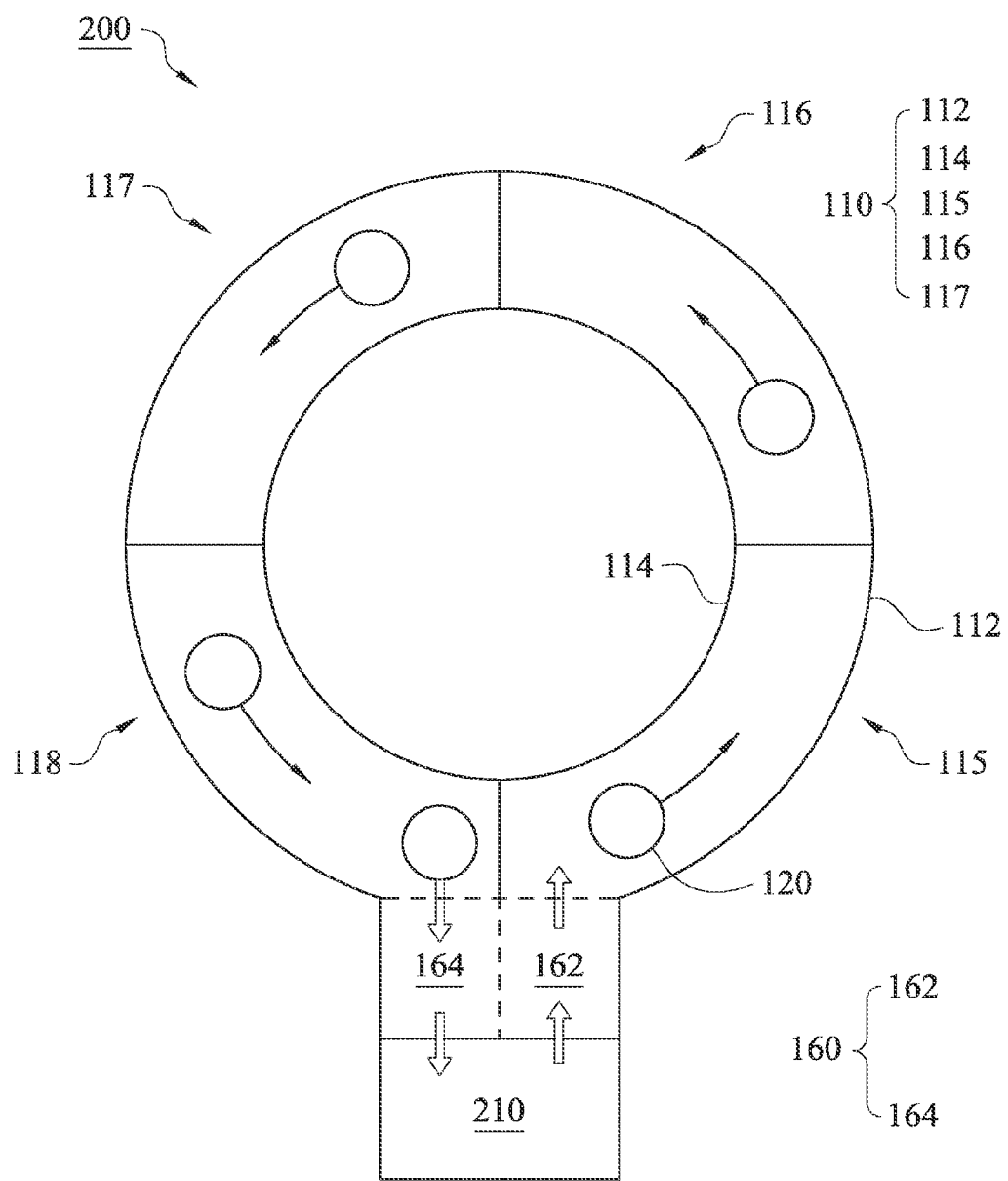
FIG. 7 is a schematic top-view illustrating the reflow tool according to various embodiments of the present disclosure.
Figure 8:
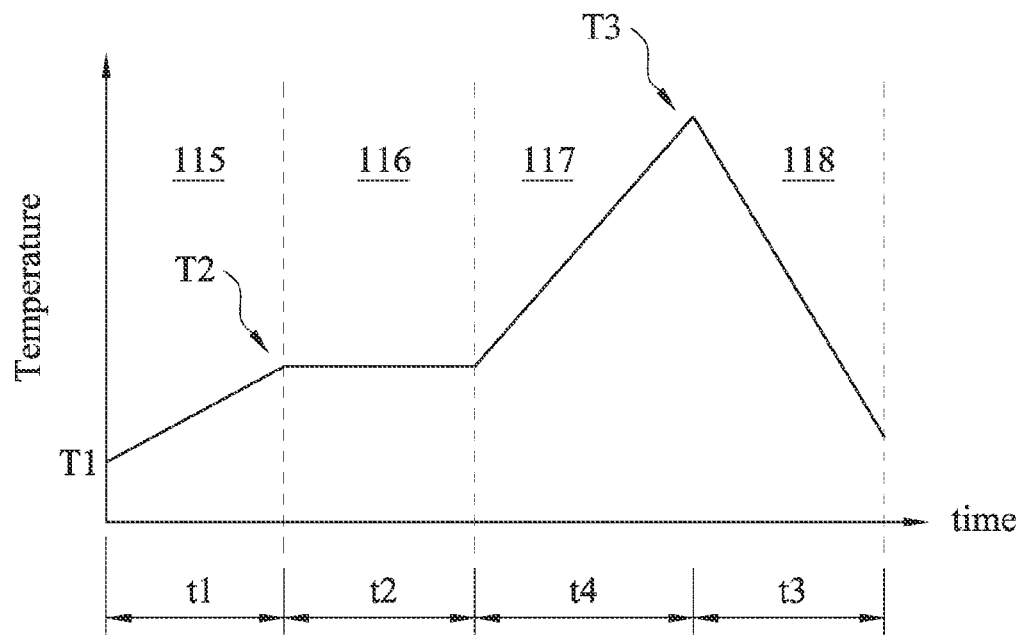
FIG. 8 is a schematic diagram of another thermal profiling illustrating the method of fluxless reflow according to various embodiments of the present disclosure.
Figure 8:
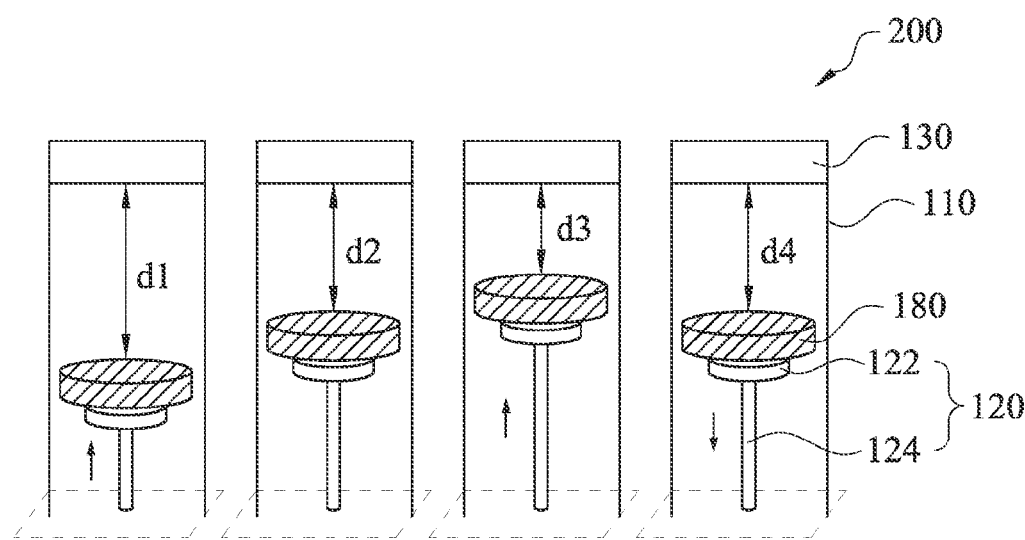

FIG. 7 is a schematic top-view illustrating the reflow tool according to various embodiments of the present disclosure, and FIG. 8 is a schematic diagram of another thermal profiling illustrating the method of fluxless reflow according to various embodiments of the present disclosure. Referring to FIG. 7 and FIG. 8, after the wafer 180 is transferred to the chamber unit 110 of the reflow tool 200. The vertical distance d1 between the wafer 180 and the heater 130 of the reflow tool 100 is formed. As illustrated in FIG. 8, the initial temperature of the wafer 180 is, for example, T1. Next, the vertical distance d1 is reduced such that the temperature of the wafer 180 is accordingly increased. For example, the temperature of the wafer 180 could be increased from T1 to T2 as illustrated in FIG. 8. Also shown in FIG. 7, the operation of reducing the vertical distance d1 could be performed in the thermal zone 115 of the chamber unit 110 of the reflow tool 200. Also shown in FIG. 8, the operation of reducing the vertical distance d1 is performed in a first period t1. The first period t1 is to preheat and establish a ramp-up rate of the temperature of the wafer 180. The details of preheating and establishing the ramp-up rate of the temperature of the wafer 180 are similar to those described in FIG. 6, and therefore the details are omitted here. The ramp-up rate could be properly controlled by the wafer lifting system 120, the temperature of the heater 130, the velocity of the circular motion of the wafer lifting system 120 (as illustrated in FIG. 7), or combinations thereof according to various solder materials applied on the wafer 180 or other process criteria.

Continually referring to FIG. 8, the vertical distance d2 is kept in a second period t2 such that the temperature of the wafer 180 is accordingly constant. For example, the temperature of the wafer 180 could be T2 as illustrated in FIG. 8. Also shown in FIG. 7, the operation of keeping the vertical distance d2 in a second period t2 could be performed in the thermal zone 116 of the chamber unit 110 of the reflow tool 200. Solders on the wafer 180 are thermally soaked, and the deoxidizing gas jetted from the jet system of the reflow tool 200 reduces surface tension of the solders on the wafer 180 to start begin oxide reduction of solders on the wafer 180. If temperature T2 is too high, solder spattering might be induced and the following operations might be impacted. On the other hand, the deoxidizing gas may not fully activate to begin oxide reduction of solders on the wafer 180 if temperature T2 is too low.

Continually referring to FIG. 8, the vertical distance is further reduced such that the temperature of the wafer 180 is accordingly increased, for example, from d2 to d3. Also shown in FIG. 7, the operation of reducing the vertical distance could be performed in the thermal zone 117 of the chamber unit 110 of the reflow tool 200. As shown in FIG. 8, the operation of reducing the vertical distance is performed in a fourth period t4. The fourth period t4 is to reflow and establish a ramp-up rate of the temperature of the wafer 180. The details of reflowing are similar to those described in FIG. 6, and therefore the details are omitted here. The difference between FIG. 8 and FIG. 6 is that another ramp-up rate is formed as the temperature/time slope in the thermal zone 117 in FIG. 8. It represents how fast the temperature of the wafer 180 changes. Solders on the wafer 180 reflow in the fourth period t4, and the fourth period t4 is the part of the reflow process where the maximum temperature, for example, T3 is reached. The jet system of the reflow tool 200 jets the deoxidizing gas to reduce surface tension of the solders on the wafer 180 to accomplish metallurgical bonding. The ramp-up rate could also be properly controlled by the wafer lifting system 120, the temperature of the heater 130, and the velocity of the circular motion of the wafer lifting system 120 (as illustrated in FIG. 7).

Continually referring to FIG. 8, the vertical distance between the wafer 180 and the heater 130 of the reflow tool 100 is increased (from d3 to d4), such that the temperature of the wafer 180 is accordingly decreased. For example, the temperature of the wafer 180 could be decreased from T3 to T1 as illustrated in FIG. 8. Also shown in FIG. 7, the operation of increasing the vertical distance, for example, from d3 to d4, could be performed in the thermal zone 118 of the chamber unit 110 of the reflow tool 200. The operation of increasing the vertical distance is performed in a third period t3. As illustrated in FIG. 8, the ramp-down rate is a temperature/time slope in the thermal zone 118. It represents how fast the temperature of the wafer 180 changes. In the third period t3, temperature of the wafer 180 is gradually cooled, and the solder joints on the wafer 180 are solidified. The details of cooling are similar to those described in FIG. 6, and therefore the details are omitted here.

Figure 9:
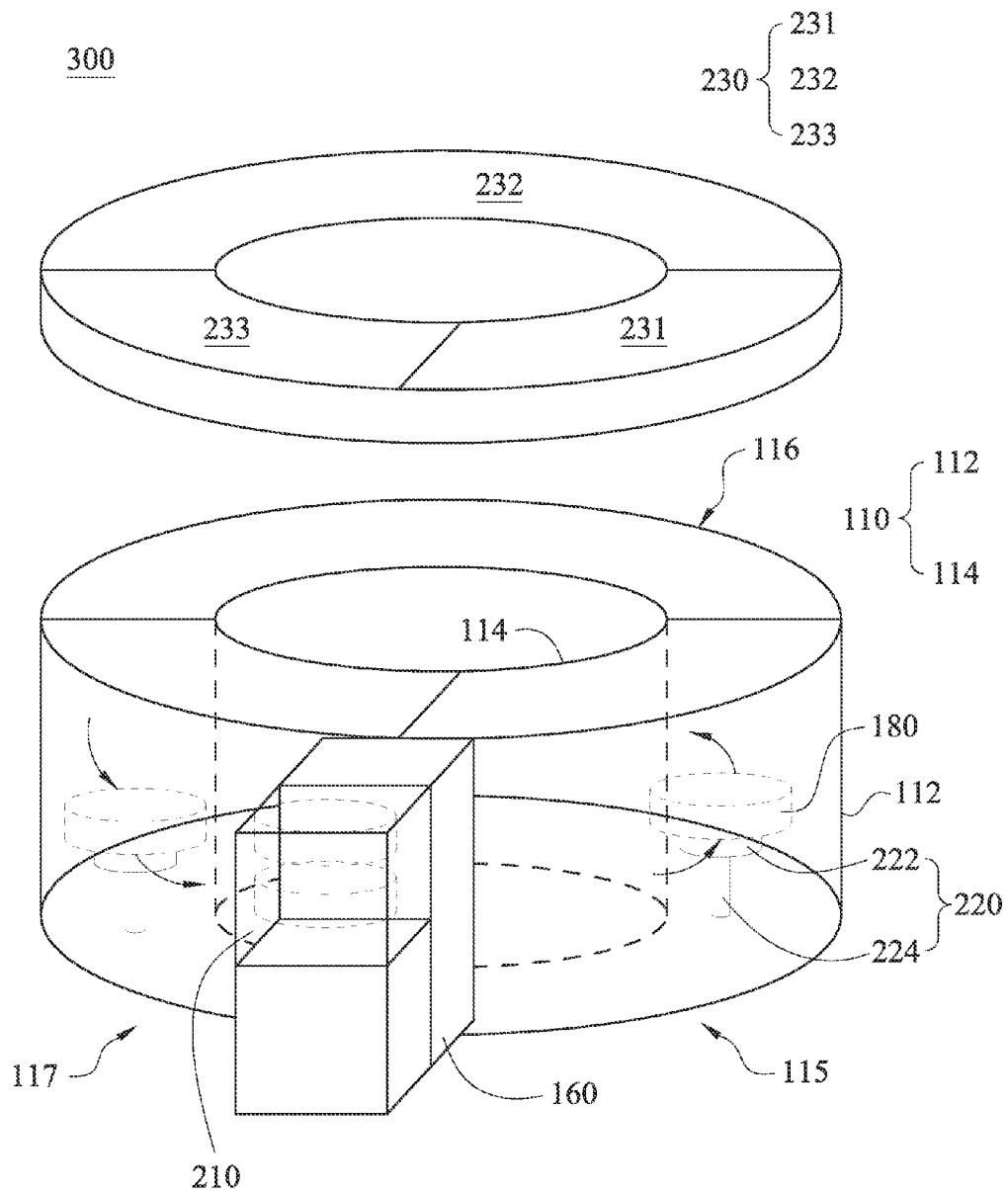
FIG. 9 is a schematic diagram illustrating a portion of a reflow tool according to various embodiments of the present disclosure.

FIG. 9 is a schematic diagram illustrating a portion of a reflow tool 300 according to various embodiments of the present disclosure. As illustrated in FIG. 9, the reflow tool 300 for the wafer 180 includes the chamber unit 110, a wafer moving system 220, a heater 230, the jet system (not shown), and the exhausting unit (not shown). The chamber unit 110, the jet system, and the exhausting unit are similar to those described above, and therefore the details are omitted here. The difference is that the heater 230 has a plurality of temperature zones 231, 232, and 233 to form a plurality of thermal zones 115, 116, and 117 in the chamber unit 110. The wafer moving system 220 is configured to receive and move the wafer 180 through the plurality of thermal zones 115, 116, and 117 in a circular motion. Therefore, the reflow tool 300 according to various embodiments of the present disclosure requires a smaller footprint than those with a straight path for the wafer to move. Accordingly, less space is required to settle the reflow tool 300 in a factory, and the cost of settling the reflow tool could be further reduced. In addition, the wafer 180 is moved by the wafer moving system 220 of the reflow tool 300 instead of putting on a transferring belt with inert gas purge of numerous reflow tools. Therefore, the wafer 180 could be moved precisely and smoothly by the wafer moving system 220, and risks of vibration during the reflow process could be eliminated. In various embodiments of the present disclosure, the wafer moving system 220 includes a wafer holder 222 and a lifting pin 224. The wafer holder 222 is configured to receive the wafer 180. The lifting pin 224 is coupled to the wafer holder 222, and configured to move the wafer 180 in the chamber unit 110. In various embodiments of the present disclosure, the lifting pin 224 moves vertically to provide a vertical distance between the heater 230 and the wafer 180 in the chamber unit 110.

According to various embodiments of the present disclosure, the wafer lifting system of the reflow tool is capable to move vertically to provide the vertical distance between the heater and the wafer in the chamber unit. Accordingly, the thermal profile of the wafer could be controlled in a flexible way. Therefore, it is not necessary for the reflow tool according to various embodiments of the present disclosure to have the heaters with various temperatures, and therefore a smaller footprint than those have the heaters with various temperatures is required. It results in less space is required to settle the reflow tool in a factory, and the cost of settling the reflow tool could be further reduced. In addition, the wafer is moved by the wafer lifting system of the reflow tool instead of putting on a transferring belt with inert gas purge. Therefore, the wafer could be moved precisely and smoothly by the wafer lifting system, and risks of vibration during the reflow process could be eliminated. Accordingly, failure of solder connection could be also improved. Furthermore, in some embodiments of the present disclosure, the wafer is moved in a circle path as illustrated in FIGS. 3, 4 and 7-9. Therefore, the reflow tool according to some embodiments of the present disclosure requires a smaller footprint than those with a straight path for the wafer to move. Accordingly, even less space is required to settle the reflow tool in a factory, and the cost of settling the reflow tool could be significantly reduced. In some embodiments of the present disclosure, the jet system could be designed in any proper shape and disposed on any proper positions to form a balance condition of jetting the deoxidizing gas of the wafer. In some embodiments of the present disclosure, the exhausting unit is disposed above the wafer, and configured to exhaust gas in the chamber unit during the reflow process. Therefore, the gas flows upward from the surface of wafer, and the risk of particles depositing on the wafer could be further reduced. In some embodiments of the present disclosure, two buffer zones coupled to the chamber unit could further improve process efficiency (wafer per hour, WPH) of the reflow tool while the wafers are processed in a continuous process.

In various embodiments of the present disclosure, the reflow tool for a wafer includes a chamber unit, a wafer lifting system, a heater, and an exhausting unit. The wafer lifting system is disposed in the chamber unit. The heater is coupled to the chamber unit, and configured to heat the wafer. The exhausting unit coupled to the chamber unit, and configured to exhaust gas in the chamber unit. The wafer lifting system is configured to receive and move the wafer in the chamber unit, and to provide a vertical distance between the heater and the wafer in the chamber unit.

In various embodiments of the present disclosure, the reflow tool for a wafer includes a chamber unit, a wafer moving system, a heater, a jet system, and an exhausting unit. The wafer moving system is disposed in the chamber unit. The heater is coupled to the chamber unit, and configured to heat the wafer. The jet system is coupled to the chamber unit, and configured to jet a deoxidizing gas on the wafer. The exhausting unit is coupled to the chamber unit, and configured to exhaust gas in the chamber unit. The heater has a plurality of temperature zones to form a plurality of thermal zones in the chamber unit, the wafer moving system is configured to receive and move the wafer through the plurality of thermal zones in a circular motion.

In various embodiments of the present disclosure, the method of reflow includes transferring a wafer to a chamber unit of a reflow tool, wherein a vertical distance between the wafer and a heater of the reflow tool is formed. The method further includes reducing the vertical distance, wherein the operation of reducing the vertical distance is performed in a first period. The method further includes keeping the vertical distance in a second period. The method further includes increasing the vertical distance, wherein the operation of increasing the vertical distance is performed in a third period. A jet system of the reflow tool jets a deoxidizing gas during the operation of reducing the vertical distance and the operation of keeping the vertical distance in the second period.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A tool comprising:
a ring shape chamber unit having an inner cylindrical wall and an outer cylindrical wall, wherein the inner cylindrical wall and the outer cylindrical wall defines the ring shape chamber;
a wafer lifting system disposed in the ring shape chamber, wherein the wafer lifting system comprises a wafer holder configured to support a wafer and a lifting pin coupled to the wafer holder;
a heater coupled to the ring shape chamber unit, and configured to heat the wafer; and
an exhausting unit coupled to the ring shape chamber unit, and configured to exhaust gas in the ring shape chamber,
wherein the heater is disposed between the exhausting unit and the wafer lifting system, and the wafer lifting system is configured to move the wafer in a spiral motion and to provide varying vertical distance between the heater and the wafer by vertically moving the lifting pin as the wafer lifting system moves in a spiral motion within the ring shape chamber.

2. The tool of claim 1, further comprising a jet system coupled to the ring shape chamber unit, and configured to jet a deoxidizing gas on the wafer.

3. The tool of claim 2, wherein the jet system is disposed on the inner cylindrical wall and the outer cylindrical wall of the ring shape chamber unit to jet the deoxidizing gas into the ring shape chamber.

4. The tool of claim 1, wherein the ring shape chamber unit comprises:
a first thermal zone, a second thermal zone and a third thermal zone which are disposed side by side in the ring shape chamber to form a circle.

5. The tool of claim 1, wherein the heater is disposed above the ring shape chamber unit.

6. The tool of claim 5, wherein the ring shape chamber unit is covered by the heater.

7. The tool of claim 6, wherein the heater has a plurality of temperature zones.

8. The tool of claim 5, wherein the heater has a plurality of slits, and the exhausting unit is configured to exhaust gas in the ring shape chamber through the plurality of slits.

9. The tool of claim 1, further comprising:
a buffer zone coupled to the ring shape chamber unit; and
at least one front opening unified pod coupled to the buffer zone, wherein the buffer zone is configured to transfer the wafer between the front opening unified pod and the wafer lifting system.

10. The tool of claim 9, wherein the buffer zone comprises:
a first buffer zone coupled to the ring shape chamber unit, and configured to transfer the wafer from the front opening unified pod to the wafer lifting system; and
a second buffer zone coupled to the ring shape chamber unit, and configured to transfer the wafer from the wafer lifting system to the front opening unified pod.

11. A tool comprising:
a ring shape chamber unit having an inner cylindrical wall and an outer cylindrical wall, wherein the inner cylindrical wall and the outer cylindrical wall defines a ring shape chamber;
a wafer lifting system disposed in the ring shape chamber, wherein the wafer lifting system comprises a wafer holder configured to support a wafer and a lifting pin coupled to the wafer holder;
a heater coupled to the ring shape chamber unit, and configured to heat the wafer;
a jet system coupled to the ring shape chamber unit, and configured to jet a deoxidizing gas on the wafer; and
an exhausting unit coupled to the ring shape chamber unit, and configured to exhaust gas in the ring shape chamber,
wherein the heater is disposed between the exhausting unit and the wafer lifting system, and the wafer lifting system is configured to move the wafer in a spiral motion and to provide varying vertical distance between the heater and the wafer by vertically moving the lifting pin as the wafer lifting system moves in a spiral motion within the ring shape chamber.

12. A tool comprising:
a ring shape chamber unit having an inner cylindrical wall and an outer cylindrical wall, wherein the inner cylindrical wall and the outer cylindrical wall defines a ring shape chamber;
at least one front opening unified pod coupled to the ring shape chamber unit;
a wafer lifting system disposed in the ring shape chamber, wherein the wafer lifting system comprises a wafer holder configured to support a wafer and a lifting pin coupled to the wafer holder;
a heater coupled to the ring shape chamber unit, and configured to heat the wafer; and
an exhausting unit configured to exhaust gas in the ring shape chamber, wherein the heater is disposed between the exhausting unit and the wafer lifting system,
wherein the wafer lifting system is configured to move the wafer in a spiral motion and to provide varying vertical distance between the heater and the wafer by vertically moving the lifting pin as the wafer lifting system moves in a spiral motion within the ring shape chamber.

13. The tool of claim 12, further comprising a buffer zone connected to the front opening unified pod and the ring shape chamber.

14. The tool of claim 13, wherein the lifting pin is further movable in the buffer zone.

15. The tool of claim 13, wherein the buffer zone comprises:
an input buffer zone; and
an output buffer zone adjacent to the input buffer zone.

* * * * *